US012160205B2

United States Patent
Jo et al.

(10) Patent No.: US 12,160,205 B2
(45) Date of Patent: Dec. 3, 2024

(54) AMPLIFIER AND DRIVER CIRCUIT

(71) Applicant: Nippon Telegraph and Telephone Corporation, Tokyo (JP)

(72) Inventors: Teruo Jo, Tokyo (JP); Munehiko Nagatani, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 124 days.

(21) Appl. No.: 18/005,928

(22) PCT Filed: Jul. 21, 2020

(86) PCT No.: PCT/JP2020/028254
§ 371 (c)(1),
(2) Date: Jan. 18, 2023

(87) PCT Pub. No.: WO2022/018824
PCT Pub. Date: Jan. 27, 2022

(65) Prior Publication Data
US 2023/0299724 A1   Sep. 21, 2023

(51) Int. Cl.
*H03F 1/42* (2006.01)
*H03F 3/45* (2006.01)

(52) U.S. Cl.
CPC ........... *H03F 1/42* (2013.01); *H03F 3/45179* (2013.01); *H03F 2200/36* (2013.01)

(58) Field of Classification Search
CPC ..... H03F 1/42; H03F 3/45179; H03F 2200/36
USPC .......................................................... 398/182
See application file for complete search history.

(56) References Cited

U.S. PATENT DOCUMENTS

| | | | | |
|---|---|---|---|---|
| 7,295,072 | B2* | 11/2007 | Takaso ................ | H03F 3/45085 330/261 |
| 10,116,269 | B1* | 10/2018 | Vera ...................... | H03F 1/3211 |
| 2011/0234319 | A1* | 9/2011 | Tsuzaki ............... | H03F 3/45179 330/257 |
| 2014/0132351 | A1* | 5/2014 | Tsunoda .............. | H03F 3/45085 330/291 |
| 2017/0126191 | A1* | 5/2017 | Nallani ................ | H03G 3/3084 |
| 2018/0083584 | A1* | 3/2018 | Yuan .................... | H03G 1/0023 |

(Continued)

FOREIGN PATENT DOCUMENTS

JP          2001168660 A  *  6/2001

OTHER PUBLICATIONS

Tomoki et al; Offset Cancellation with Subthreshold-operated Feedback Circuit for Fully Differential Amplifiers ; 2009; IEEE; pp. 1-4. (Year: 2009).*

(Continued)

*Primary Examiner* — Amritbir K Sandhu
(74) *Attorney, Agent, or Firm* — Slater Matsil, LLP

(57) ABSTRACT

An amplifier circuit comprises a variable degeneration circuit connected to emitter terminals of transistors, and a variable negative capacitance circuit connected to differential output signal terminals. The variable degeneration circuit includes a variable capacitor and a resistor. The variable negative capacitance circuit, which is a variable current source, includes a transistor, a capacitor, and a variable current source. The variable negative capacitance circuit includes transistors, a capacitor, and variable current sources.

17 Claims, 10 Drawing Sheets

(56) References Cited

U.S. PATENT DOCUMENTS

2023/0198472 A1* 6/2023 Hamada ................ H03F 1/086
                                                                330/296

OTHER PUBLICATIONS

Jyo et al., "A 48GHz BW 225mW/ch Linear Driver IC with Stacked Current-Reuse Architecture in 65nm CMOS for Beyond-400Gb/s Coherent Optical Transmitters," Jun. 2020, IEEE International Solid-State Circuits Conference, doi:10.1109/ISSCC19947.2020. 9063027, pp. 212-214. As discussed in the specification.

* cited by examiner

AMPLIFIER AND DRIVER CIRCUIT

CROSS-REFERENCE TO RELATED APPLICATIONS

This application is a national phase entry of PCT Application No. PCT/JP2020/028254, filed on Jul. 21, 2020, which application is hereby incorporated herein by reference.

TECHNICAL FIELD

The present invention relates to an amplifier circuit used in a driver circuit or the like for driving an optical modulator.

BACKGROUND

A modulator driver circuit used in a transmitter for optical communication is used to drive an optical modulator in an optical transmitter and serves to amplify the amplitude intensity of an electric signal to be transmitted to a level at which the optical modulator can be driven. In recent years, the symbol rate required for the optical transmitter exceeds 100 GBaud, and in order to realize the symbol rate, the optical transmitter requires a band of 50 GHz or more.

On the other hand, the package portion of the optical modulator and the optical transmitter has such the frequency characteristics that a signal loss increases as the frequency is higher. In order to realize a desired band of the optical transmitter, it is necessary to compensate for loss of high frequency. As one of the compensation methods, there is a method of providing a driver circuit with frequency peaking characteristics. The peaking characteristics is required to be the frequency characteristics reverse to the signal loss (characteristics of higher gain at higher frequency). Furthermore, it is required that the driver circuit has a function of adjusting a peaking amount in order to suppress variations in characteristics.

As a conventional frequency peaking method, there is a method of adding inductors L100 and L101 to the output of a differential amplifier circuit comprising transistors Q100 to Q102 as shown in FIG. 10. Furthermore, by using variable resistors R100 and R101 as a load resistance of the differential amplifier circuit, the amount of peaking can be adjusted (refer to NPL 1). For example, when the variable resistors R100 and R101 is adjusted to a small value, the peaking characteristics is obtained such that the gain on a low frequency side is lowered and the gain on a high frequency side is relatively increased.

However, there was a difficult problem that the desired peaking characteristics (frequency characteristics opposite to the frequency characteristics of loss) can be realized over a wide band of 50 GHz or more, although the conventional frequency peaking method can increase the gain near a specific frequency.

CITATION LIST

Non Patent Literature

[NPL 1] Teruo Jyo, Munehiko Nagatani, Josuke Ozaki, Mitsuteru Ishikawa, Hideyuki Nosaka, "A 48 GHz BW 225 mW/ch Linear Driver IC with Stacked Current-Reuse Architecture in 65 nm CMOS for Beyond-400 Gb/s Coherent Optical Transmitters", 2020 IEEE International Solid-State Circuits Conference—(ISSCC), San Francisco, CA, USA, 2020, pp.212-214, doi: 10.1109/ISSCC19947.2020.9063027.

SUMMARY

Technical Problem

The purpose of embodiments of the present invention is to solve the above problem and to provide an amplifier circuit and a driver circuit capable of achieving desired peaking characteristics over a wide band.

Solution to Problem

An amplifier circuit of embodiments of the present invention, comprising: a first transistor and a second transistor having a differential configuration in which a base terminal is connected to a differential input signal terminal of an amplifier circuit, a third transistor having a base terminal connected to a collector terminal of the second transistor, a collector terminal connected to a power supply voltage, and an emitter terminal connected to a first output signal terminal on a positive phase side of an amplifier circuit, a fourth transistor having a base terminal connected to a collector terminal of the first transistor, a collector terminal connected to the power supply voltage, and an emitter terminal connected to a second output signal terminal on an opposite phase side of the amplifier circuit, a variable degeneration circuit connected to emitter terminals of the first and the second transistors, a variable negative capacitance circuit connected to the first and second output signal terminals; and wherein the variable degeneration circuit includes a variable capacitance and a first resistor are connected in parallel between an emitter terminal of the first transistor and an emitter terminal of the second transistor, the variable negative capacitance circuit includes fifth and sixth transistors whose collector terminals are connected to the first and second output signal terminals and whose base terminals and collector terminals are connected in a cross-coupled manner, a capacitor connected between an emitter terminal of the fifth transistor and an emitter terminal of the sixth transistor, a first variable current source having one end connected to an emitter terminal of the fifth transistor and the other end connected to ground, a second variable current source having one end connected to an emitter terminal of the sixth transistor and the other end connected to ground.

An amplifier circuit of embodiments of the present invention, comprising: a first transistor and a second transistor having a differential configuration in which a base terminal is connected to a differential input signal terminal of an amplifier circuit, a third transistor having a base terminal connected to a collector terminal of the second transistor, a collector terminal connected to a power supply voltage, and an emitter terminal connected to a first output signal terminal on a positive phase side of an amplifier circuit, a fourth transistor having a base terminal connected to a collector terminal of the first transistor, a collector terminal connected to the power supply voltage, and an emitter terminal connected to a second output signal terminal on an opposite phase side of the amplifier circuit, a variable degeneration circuit connected to emitter terminals of the first and the second transistors, a variable negative capacitance circuit connected to the first and second output signal terminals; and wherein the variable degeneration circuit includes a first resistor connected between an emitter terminal of the first transistor and an emitter terminal of the second transistor, a first capacitor and a first variable resistor connected in series between an emitter terminal of the first transistor and an emitter terminal of the second transistor, a second variable resistor and a second capacitor connected in series between the emitter terminal of the first transistor and the emitter terminal of the second transistor, the variable negative capacitance circuit includes fifth and sixth transistors whose collector terminals are connected to the first and second output signal terminals and whose base terminals and collector terminals are connected in a cross-coupled manner, a third capacitor a fourth capacitor connected in series between an emitter terminal of the fifth transistor and an emitter terminal of the sixth transistor, a first variable current source having one end connected to an emitter terminal of the fifth transistor and the other end connected to ground, a second variable current source having one end connected to an emitter terminal of the sixth transistor and the other end connected to ground, the variable degeneration circuit, which an arrangement of the circuit in the direction from the emitter terminal of the first transistor to the emitter terminal of the second transistor and the arrangement of the circuit in the direction from the emitter terminal of the second transistor to the emitter terminal of the first transistor are equal, the variable negative capacitance circuit, which an arrangement of the circuit in the direction from the emitter terminal of the fifth transistor to the emitter terminal of the sixth transistor and the arrangement of the circuit in the direction from the emitter terminal of the sixth transistor to the emitter terminal of the fifth transistor are equal.

An amplifier circuit of embodiments of the present invention, comprising: a first transistor and a second transistor having a differential configuration in which a base terminal is connected to a differential input signal terminal of an amplifier circuit, a third transistor having a base terminal connected to a collector terminal of the second transistor, a collector terminal connected to a power supply voltage, and an emitter terminal connected to a first output signal terminal on a positive phase side of an amplifier circuit, a fourth transistor having a base terminal connected to a collector terminal of the first transistor, a collector terminal connected to the power supply voltage, and an emitter terminal connected to a second output signal terminal on an opposite phase side of the amplifier circuit, a variable degeneration circuit connected to emitter terminals of the first and the second transistors, a variable negative capacitance circuit connected to the first and second output signal terminals; and wherein the variable degeneration circuit includes a variable capacitance and a first resistor are connected in parallel between an emitter terminal of the first transistor and an emitter terminal of the second transistor, the variable negative capacitance circuit includes fifth and sixth transistors whose collector terminals are connected to the first and second output signal terminals and whose base terminals and collector terminals are connected in a cross-coupled manner, a seventh transistor having a base terminal and a collector terminal connected to an emitter terminal of the fifth transistor, an eighth transistor having a base terminal and a collector terminal connected to an emitter terminal of the sixth transistor, a first variable current source having one end connected to an emitter terminal of the seventh transistor and another end connected to ground, and a second variable current source having one end connected to an emitter terminal of the eighth transistor and the other end connected to ground.

An amplifier circuit of embodiments of the present invention, comprising: a first transistor and a second transistor having a differential configuration in which a base terminal is connected to a differential input signal terminal of an amplifier circuit, a third transistor having a base terminal connected to a collector terminal of the second transistor, a collector terminal connected to a power supply voltage, and an emitter terminal connected to a first output signal terminal on a positive phase side of an amplifier circuit, a fourth transistor having a base terminal connected to a collector terminal of the first transistor, a collector terminal connected to the power supply voltage, and an emitter terminal connected to a second output signal terminal on an opposite phase side of the amplifier circuit, a variable degeneration circuit connected to emitter terminals of the first and the second transistors, a variable negative capacitance circuit connected to the first and second output signal terminals; and wherein the variable degeneration circuit includes a first resistor connected between an emitter terminal of the first transistor and an emitter terminal of the second transistor, a first capacitor and a first variable resistor connected in series between an emitter terminal of the first transistor and an emitter terminal of the second transistor, a second variable resistor and a second capacitor connected in series between the emitter terminal of the first transistor and the emitter terminal of the second transistor, the variable negative capacitance circuit includes fifth and sixth transistors whose collector terminals are connected to the first and second output signal terminals and whose base terminals and collector terminals are connected in a cross-coupled manner, a seventh transistor having a base terminal and a collector terminal connected to an emitter terminal of the fifth transistor, an eighth transistor having a base terminal and a collector terminal connected to an emitter terminal of the sixth transistor, a first variable current source having one end connected to an emitter terminal of the seventh transistor and the other end connected to ground, a second variable current source having one end connected to an emitter terminal of the eighth transistor and the other end connected to ground.

The driver circuit of embodiments of the present invention includes the amplifier circuit.

The driver circuit of the present invention is characterized in that the amplifier circuit and an amplifier circuit of a fixed frequency peaking amount are connected in cascade.

Advantageous Effects of embodiments of the Invention

According to embodiments of the present invention, frequency peaking is realized by combining two topologies of a variable degeneration circuit and a variable negative capacitance circuit. Since the variable degeneration circuit and the variable negative capacitance circuit have peaking frequencies on the low frequency side and the high frequency side respectively and the respective peaking amounts can be adjusted independently, desired peaking characteristics can be realized over a wide band of 50 GHz or more. Further, in embodiments of the present invention, since a DC gain does not fluctuate by the adjustment of the peaking amount, the DC gain higher than that of the conventional amplifier circuit can be realized.

DETAILED DESCRIPTION OF ILLUSTRATIVE EMBODIMENTS

Example 1

Figure 1:
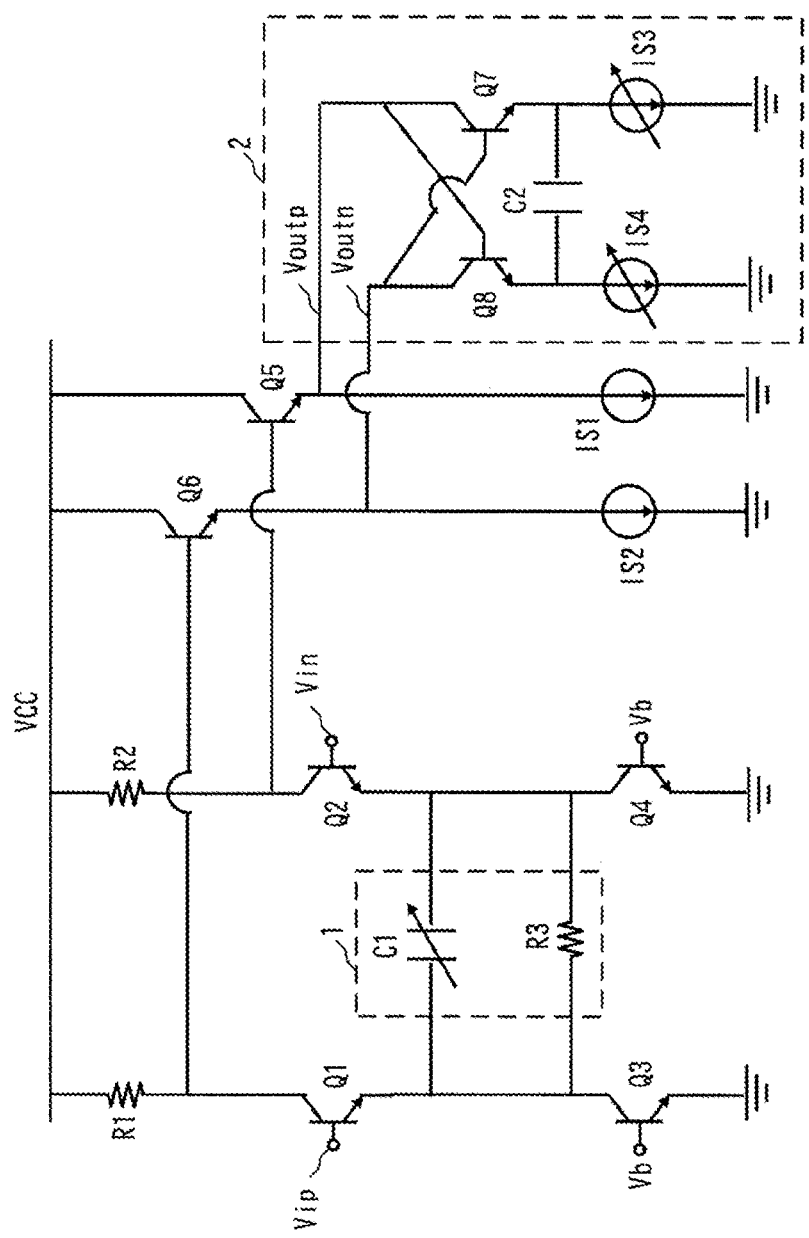
FIG. 1 shows a circuit diagram showing configuration of an amplifier circuit according to a first embodiment of the present invention.

Hereinafter, an embodiment of the present invention will be described with reference to the drawings. FIG. 1 is a circuit diagram showing a configuration of an amplifier circuit according to a first embodiment of the present invention. The amplification circuit of this embodiment includes the transistor Q1 and Q2 whose base terminal is connected to the differential input signal terminals Vip and Vin of the amplification circuit, and a current source transistor Q3 whose base terminal is connected to the bias voltage Vb, whose collector terminal is connected to the emitter terminal of the transistor Q1, and whose emitter terminal is connected to the ground, a current source transistor Q4 whose base terminal is connected to the bias voltage Vb, whose collector terminal is connected to the emitter terminal of the transistor Q2, and whose emitter terminal is connected to the ground, a transistor Q5 whose base terminal is connected to the collector terminal of transistor Q2, whose collector terminal is connected to the power supply voltage VCC, whose emitter terminal is connected to the output signal terminal Voutp on the positive phase side of the amplification circuit, a transistor Q6 whose base terminal is connected to the collector terminal of transistor Q1, whose collector terminal is connected to the power supply voltage VCC, and whose emitter terminal is connected to the output signal terminal Voutn on the opposite phase side of the amplification circuit, a transistor Q7 base terminal is connected to the output signal terminal Voutn, and whose collector terminal connected to the output signal terminal Voutp, a transistor Q8 whose base terminal connected to the output signal terminal Voutp, and whose collector terminal is connected to the output signal terminal Voutn, a resistor R1 whose one end is connected to the collector terminal of the transistor Q1, and whose another end connected to the power supply voltage VCC, a resistor R2 whose one end is connected to the collector terminal of the transistor Q2, and whose another end connected to the power supply voltage VCC, a resistor R3 whose one end is connected to the emitter terminal of the transistor Q1, and whose another end connected to the emitter terminal of the transistor Q2, a variable capacitor C1 whose one end is connected to the emitter terminal of the transistor Q1, and whose another end connected to the emitter terminal of the transistor Q2, a capacitor C2 whose one end is connected to the emitter terminal of the transistor Q7, and whose another end connected to the emitter terminal of the transistor Q8, a constant current source IS1 whose one end is connected to the emitter terminal of the transistor Q5, and whose another end connected to the ground, a constant current source IS2 whose one end is connected to the emitter terminal of the transistor Q6, and whose another end connected to the ground, a variable current source IS3 whose one end is connected to the emitter terminal of the transistor Q7, and whose another end connected to the ground, and a variable current source IS4 whose one end is connected to the emitter terminal of the transistor Q8, and whose another end connected to the ground.

The variable capacitance C1 and the resistor R3 connected in parallel between the emitter terminal of the transistor Q1 and the emitter terminal of the transistor Q2 constitute a variable degeneration circuit 1. The transistors Q7 and Q8, the capacitor C2, and the variable current sources IS3 and IS4 constitute a variable negative capacitance circuit 2.

In this embodiment, wide-band frequency peaking characteristics is realized by combining the variable degeneration circuit 1 and the variable negative capacitance circuit 2. The variable degeneration circuit 1 takes charge of frequency peaking on a low frequency side. By adjusting the capacitance value of the variable capacitance C1, the peaking amount can be adjusted. The variable capacitor C1 may be, for example, the varactor composed of a MOS transistor.

In the variable negative capacitance circuit 2, two transistors Q7 and Q8 are connected in a cross-coupled type, and the capacitor C2 is connected to emitter terminals of the transistors Q7 and Q8. With such a configuration, the variable negative capacitance circuit 2 functions as a negative capacitance added to the differential output signal terminals Voutp and Voutn (emitter terminals of the transistors Q5 and Q6). The capacitor C2 may be, for example, an MIM (Metal-Insulator-Metal) capacitor.

The variable negative capacitance circuit 2 mainly takes charge of frequency peaking on the high frequency side. The peaking amount can be adjusted by adjusting the current flowing to the variable negative capacitance circuit 2 by variable current sources IS3 and IS4.

A negative capacitance circuit is generally used in a narrow-band circuit such as an oscillator or a mixer, and is not suitable for the amplifier circuit requiring a wide band. In this embodiment, by combining with the variable degeneration circuit 1 which is responsible for the frequency peaking on the low frequency side, the negative capacitance circuit can be applied to the amplifier circuit, and the wide-band frequency peaking becomes possible. Since the negative capacitance circuit is small in size, the parasitic capacitance is small, and it is suitable for taking charge of frequency peaking on the high frequency side.

Figure 2:
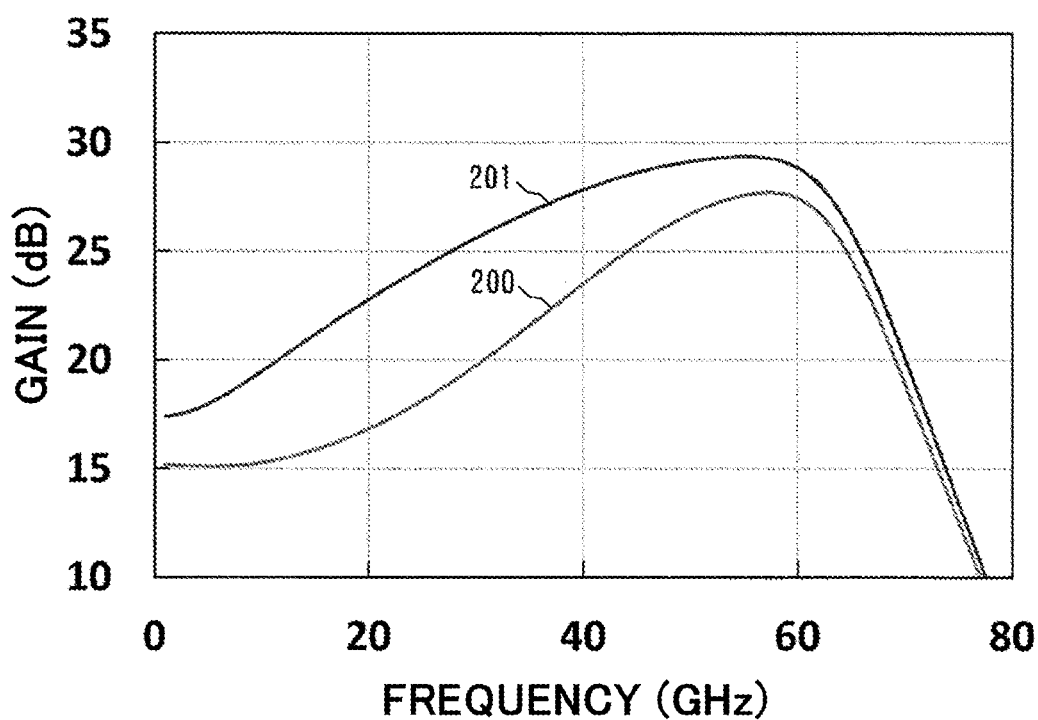
FIG. 2 is a diagram showing a simulation result of the gain of a conventional amplifier circuit and an amplifier circuit according to the first embodiment of the present invention.
Figure 10:
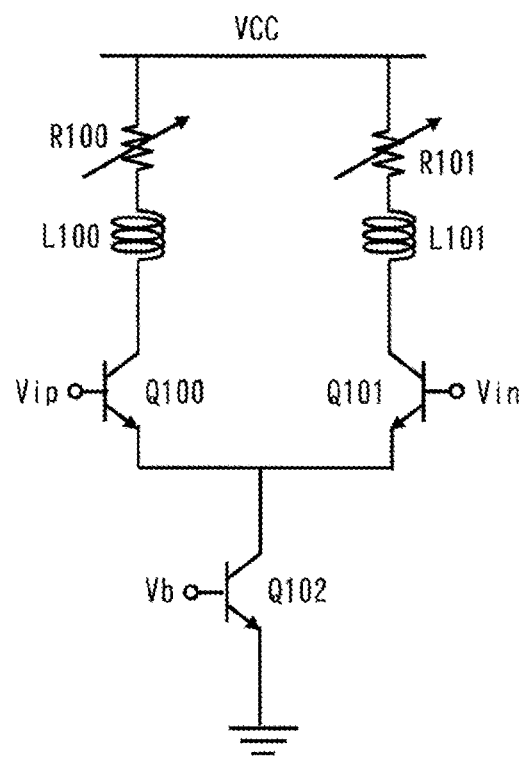
FIG. 10 is a circuit diagram illustrating a frequency peaking method of a conventional driver circuit.

FIG. 2 shows the results of simulation of the gains of a conventional amplifier circuit and the amplifier circuit of this embodiment. 200 in FIG. 2 shows the gain of the conventional amplifier circuit shown in FIG. 10, and FIG. 2 shows the gain of the amplifier circuit of this embodiment. In the conventional amplifier circuit, the gain can be increased greatly near 50 GHz, but the gain on the low frequency side is small. On the other hand, in this embodiment, the gain can be uniformly increased from a low frequency to the vicinity of 50 GHz.

Figure 3:
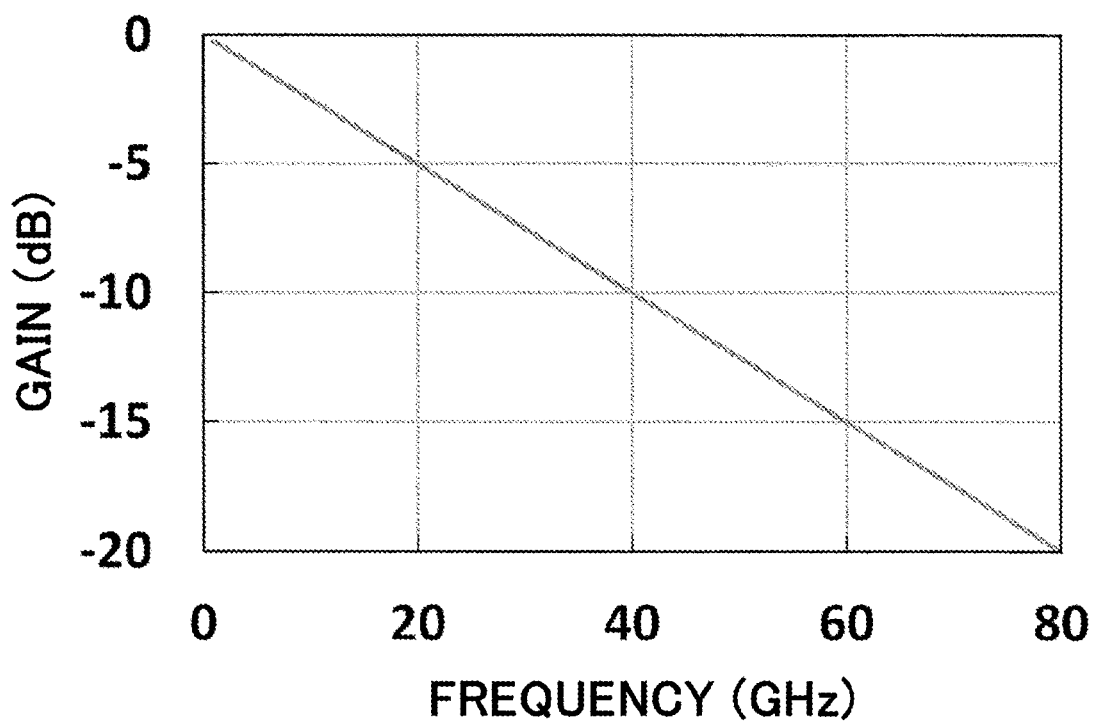
FIG. 3 is a diagram showing an example of the frequency characteristics of a signal loss of an optical transmitter.
Figure 4:
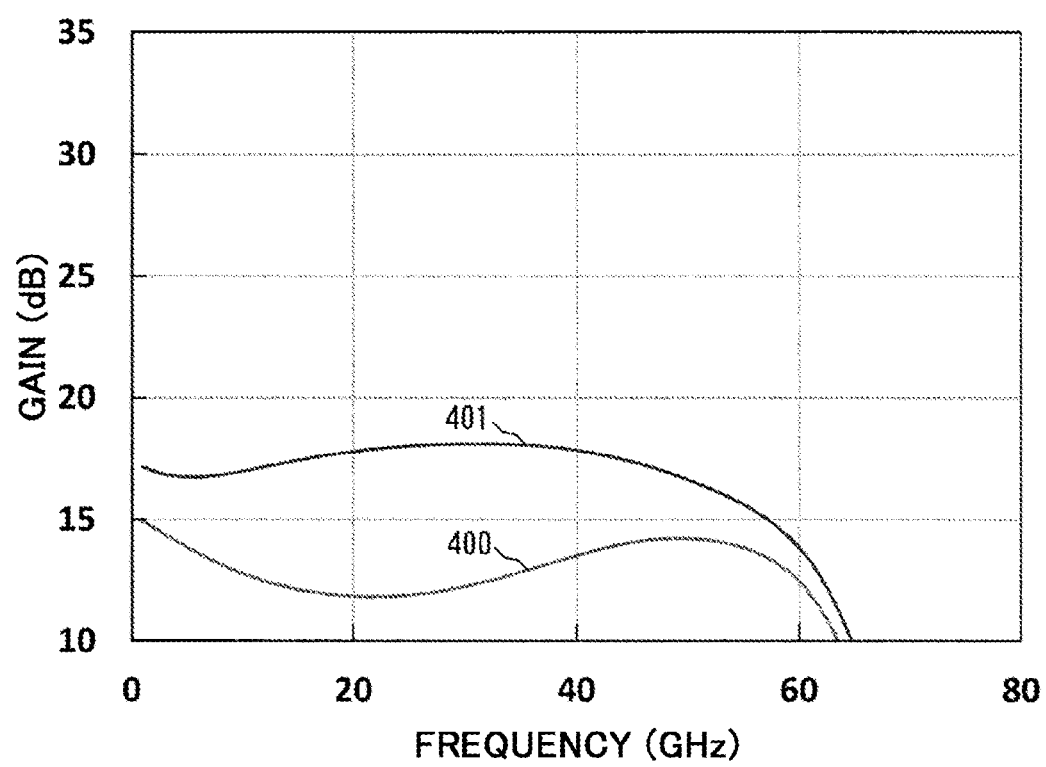
FIG. 4 is a diagram showing frequency characteristics of the optical transmitter after compensating for the signal loss by the conventional amplifier circuit and an amplifier circuit according to the first embodiment of the present invention.

Assuming that a signal loss in an optical transmitter has the frequency characteristics as shown in FIG. 3, the frequency characteristics of the optical transmitter is improved as shown in FIG. 4 when the amplifier circuit of this embodiment is applied to a driver circuit for driving the optical modulator in the optical transmitter. 400 in FIG. 4 shows the frequency characteristics of the optical transmitter when the conventional amplifier circuit is applied to the driver circuit, and 401 shows the frequency characteristics of the optical transmitter when the amplifier circuit of the present embodiment is applied to the driver circuit.

When the conventional amplifier circuit is used for the driver circuit, the gain is greatly reduced per 20 GHz, and the band is limited. On the other hand, when the amplifier circuit of this embodiment is used for the driver circuit, flat frequency characteristics can be realized up to 50 GHz or more.

In addition, in the amplifier circuit of this embodiment, it is not necessary to lower the DC gain in adjusting the peaking amount, and it is possible to realize a higher DC gain than the conventional amplifier circuit. The DC gain is basically determined by a transconductance, a collector resistance and an emitter resistance of the input transistor. In the conventional amplifier circuit shown in FIG. 10, since the value of the variable resistors R100 and R101 on the collector side is adjusted, the DC gain is varied. When the variable resistors R100 and R101 are adjusted to a small value, the peaking characteristics is obtained such that the DC gain is lowered and the gain on the high frequency side is relatively increased.

On the other hand, when the peaking amount is adjusted by the amplifier circuit of this embodiment, since any value of the transconductance of the transistors Q1 and Q2 and the resistances R1 and R3 is not changed, The DC gain does not change.

When the amplifier circuit of this embodiment is applied to the driver circuit of the optical transmitter, the optimum bias point on the optical modulator side is not deviated even if the peaking amount of the amplifier circuit is adjusted, so that total loss of the optical transmitter is not increased.

Example 2

Figure 5:
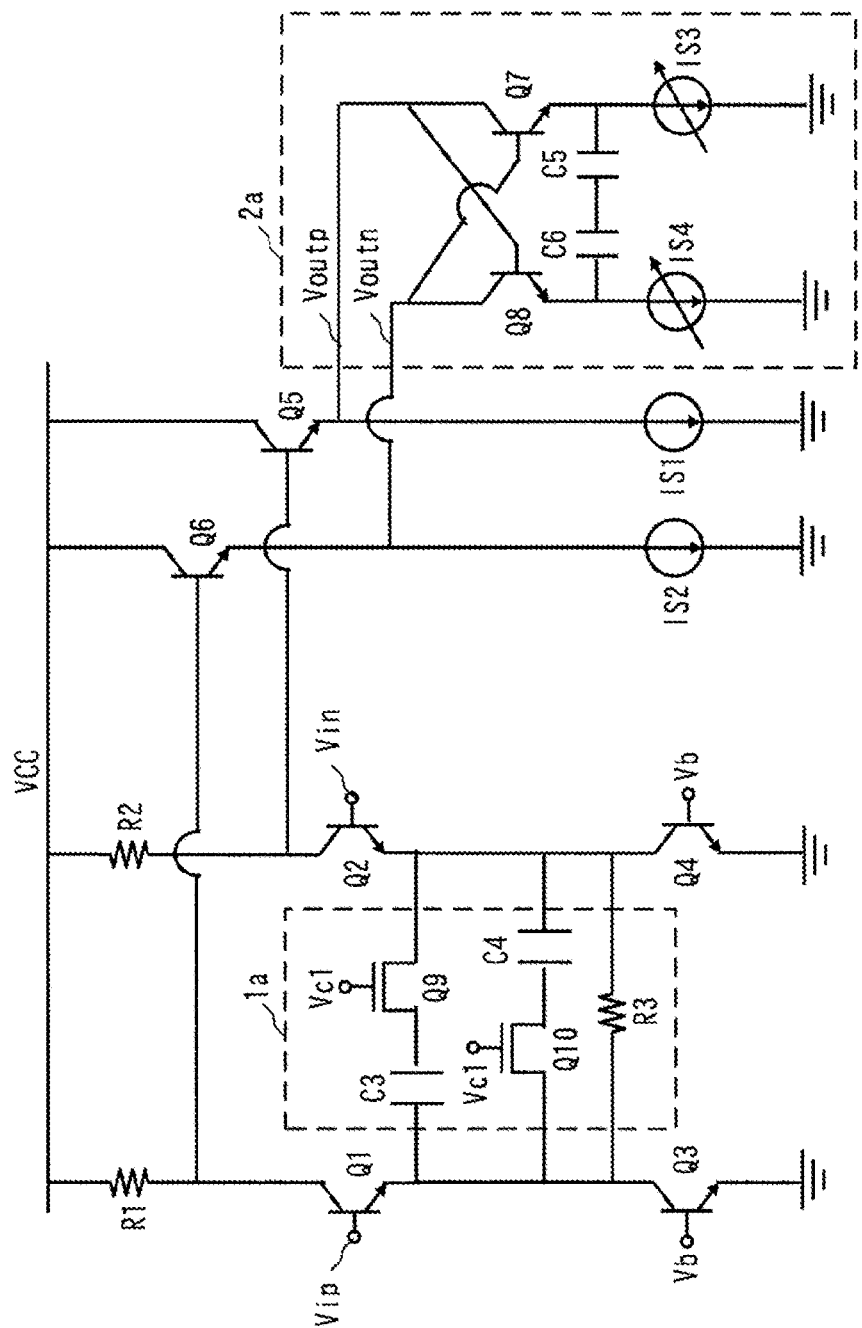
FIG. 5 is a circuit diagram showing a configuration of an amplifier circuit according to a second embodiment of the present invention.

Next, a second embodiment of the present invention will be described. FIG. 5 is a circuit diagram showing a configuration of an amplifier circuit according to a second embodiment of the present invention. The amplification circuit of this embodiment include transistors Q1 to Q8, resistors R1 to R3, constant current sources IS1 and IS2, variable current sources IS3 and IS4, and the MOS transistor Q9 whose gate terminal is applied to a control voltage Vc1, and whose drain terminal is connected to the emitter terminal of a transistor Q2, the MOS transistor Q10 whose gate terminal is applied to the control voltage Vc1, and whose drain terminal is connected to the emitter terminal of a transistor Q1, a capacitor C3 whose one end is connected to the source terminal of the MOS transistor Q9, and whose another end is connected to the emitter terminal of the transistor Q1, a capacitor C4 whose one end is connected to the source terminal of the MOS transistor Q10, and whose anther end is connected to the emitter terminal of the transistor Q2, a capacitor C5 whose one end is connected to the emitter terminal of a transistor Q7, and a capacitor C6 whose one end is connected to the emitter terminal of a transistor Q8, and whose anther end is connected to another end of the capacitor C5.

In this embodiment, a variable degeneration circuit is is constituted of fixed capacitors C3 and C4 and a variable resistor consisting of MOS transistors Q9 and Q10. The peaking amount can be adjusted by adjusting the control voltage Vc1 applied to the gate terminal of the MOS transistors Q9 and 10. In this embodiment, the peaking amount can be adjusted in a wider peaking gain range than the variable degeneration circuit 1 disclosed in the first embodiment.

In this embodiment, two circuits in which a fixed capacitor and a variable resistor are connected in series are arranged between the emitter terminal of the transistor Q1 and the emitter terminal of the transistor Q2.

The capacitors C3 and C4 have the same value. An example of the capacitors C3 and C4 is, for example, an MIM capacitor. Although the MIM capacitor has a structure in which an insulating film is sandwiched between electrodes, but due to the layout configuration, the electrodes located above and below the insulating film do not have a symmetrical structure. Therefore, in this embodiment, the first terminals (for example, the lower electrode) having the same structure of the capacitors C3 and C4 are connected to the emitter terminal of the transistors Q1 and Q2, respectively, and the second terminals having the same structure of the capacitors C3 and C4 (for example, the upper electrode) is connected to the source terminals of the transistors Q9 and Q10, respectively.

Thus, in this embodiment, the arrangement of the circuit in the direction from the emitter terminal of the transistor Q1 to the emitter terminal of the transistor Q2 and the arrangement of the circuit in the direction from the emitter terminal of the transistor Q2 to the emitter terminal of the transistor Q1 are equal. By setting this, it is possible to prevent the transistors Q1 and Q2 of the differential pair from becoming unbalanced and prevent an increase in harmonic distortion.

Further, in this embodiment, variable negative capacitance circuit 2a is comprised of the transistors Q7 and Q8 having a base terminal and a collector terminal connected in a cross-coupled manner, the variable current sources IS3 and IS4, and capacitors C5 and C6 which are connected in series between the emitter terminal of the transistor Q7 and the emitter terminal of the transistor Q8.

The capacitors C5 and C6 have the same value. Like the capacitors C3 and C4, an example of the capacitors C5 and C6 is, for example, an MIM capacitor. In this embodiment, the first terminal (for example, the lower electrode) of the same structure of the capacitors C5 and C6 is connected to the emitter terminal of the transistors Q7 and Q8, respectively, and second terminals of the same structure of the capacitors C5 and C6 (for example, the upper electrode) are connected to each other.

Thus, in this embodiment, by equaling the arrangement of the circuit in the direction from the emitter terminal of the transistor Q7 to the emitter terminal of the transistor Q8 and the arrangement of the circuit in the direction from the emitter terminal of the transistor Q8 to the emitter terminal of the transistor Q7, it is possible to prevent the transistors Q7 and Q8 of the differential pair from becoming unbalanced and prevent an increase in harmonic distortion.

In this embodiment, in order to obtain a peaking characteristic having a slope of (15 dB±1 dB)/60 GHz as shown in FIG. 2, it is necessary to set the values of the capacitors C3 and C4 of the variable degeneration circuit 1a to 22%±10% fF, the values of the variable resistance composed of transistors Q9 and Q10 to 160%±10% Ω, and the values of the capacitances C5 and C6 of the variable negative capacitance circuit 2a to 12%±10% fF.

Example 3

Figure 6:
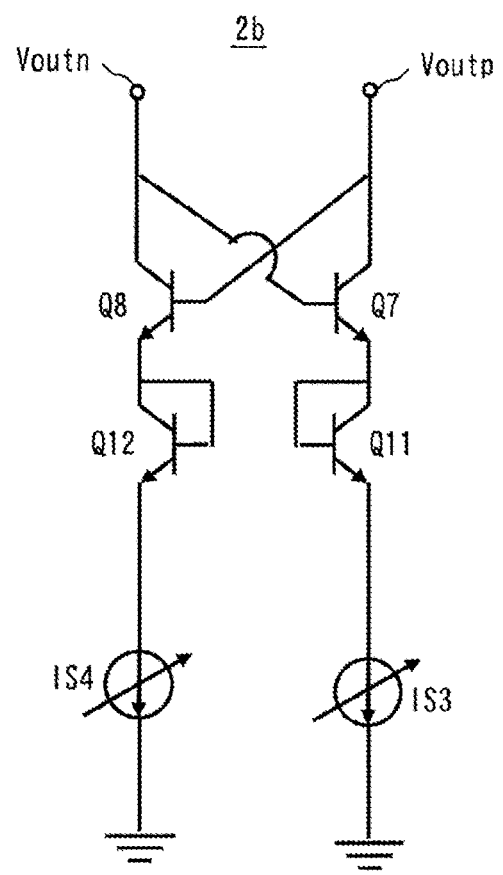
FIG. 6 is a circuit diagram showing a configuration of a variable negative capacitance circuit of an amplifier circuit according to a third embodiment of the present invention.

Next, a third embodiment of the present invention will be described. FIG. 6 is a circuit diagram showing a configuration of a variable negative capacitance circuit of an amplifier circuit according to a third embodiment of the present invention. Also in this embodiment, the entire configuration of the amplifier circuit is the same as that of the first embodiment or the second embodiment.

In the variable negative capacitance circuit 2b of this embodiment is comprised of the transistors Q7 and Q8, the variable current sources IS3 and IS4, a transistor Q11 whose base terminal and collector terminal are connected to the emitter terminal of the transistor Q7 and the emitter terminal is connected to one end of the variable current source IS3, and a transistor Q12 whose base terminal and collector terminal are connected to the emitter terminal of the transistor Q8, and whose emitter terminal is connected to one end of the variable current source IS4.

The capacitors C2, C5 and C6 used in the variable negative capacitance circuits 2 and 2a of the first and second embodiments are normally composed of MIM capacitors. In this embodiment, instead of the capacitors C2, C5 and C6, the diode-connected transistors Q11 and Q12 are inserted between the emitter terminals of the transistors Q7 and Q8, and the variable current sources IS3 and IS4 to use parasitic capacitance of the transistors Q11 and Q12.

Since the parasitic capacitance of the transistors Q11 and Q12 is usually smaller than that of the MIM capacitor, frequency peaking can be performed at a higher frequency. Further, in this embodiment, since the voltage drop of the threshold amount occurs in transistors Q11 and Q12 connected by the diode, there is a synergistic effect that the voltage applied to the collector terminal and the emitter terminal of transistors Q7 and Q8 is reduced, and the withstand voltage characteristic is improved.

Example 4

Figure 7:
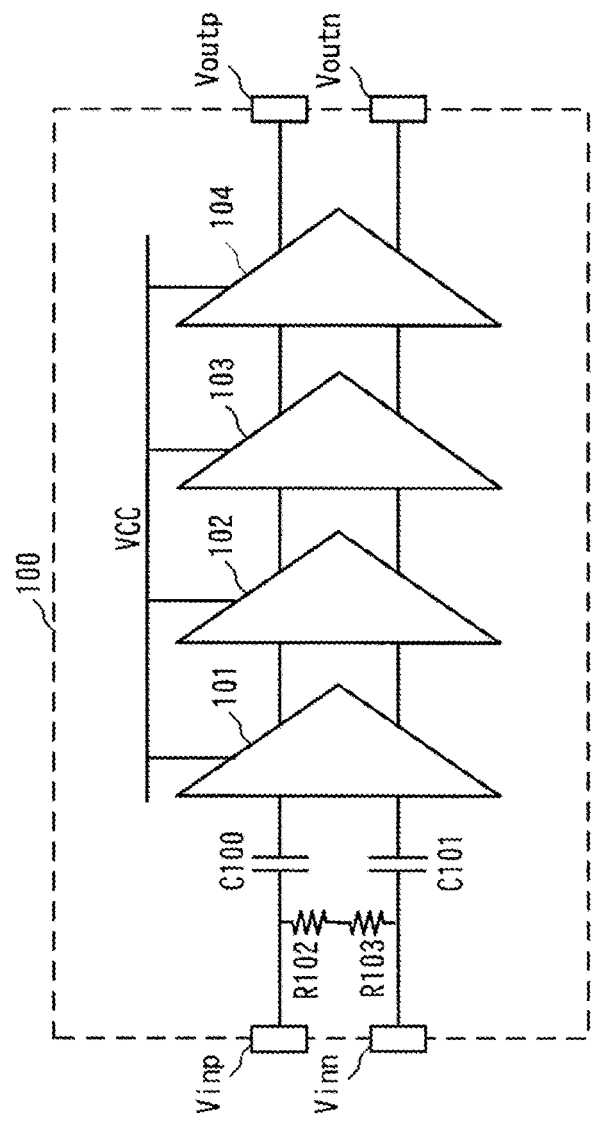
FIG. 7 is a circuit diagram showing a configuration of a driver circuit according to a fourth embodiment of the present invention.

Next, a fourth embodiment of the present invention will be described. In addition to the amplifier circuit shown in the first to third embodiments, it is possible to further extend the band of the entire driver circuit by combining an amplifier circuit having a fixed frequency peaking amount at another stage. FIG. 7 is a circuit diagram showing a configuration of a driver circuit of an optical transmitter.

The driver circuit 100 is composed of
an input buffer 101 to which a differential signal for driving an optical modulator of the subsequent stage is input, an amplifier circuit 102 which amplifies the differential signal output from the input buffer 101, an amplifier circuit 103 which amplifies the differential signal output from the amplifier circuit 102, an output circuit 104 which drives an optical modulator (not shown) connected to the differential output signal terminals Voutp and Voutn, a capacitor C100 whose one end is connected to the input signal terminal Vinp of the positive phase side of the driver circuit 100, and whose another end is connected to the non-inverting input terminal of the input buffer 101, a capacitor C101 whose one end is connected to the input signal terminal Vinn of the opposite phase side of the driver circuit 100, and whose another end is connected to the inverting input terminal of the input buffer 101, and two input termination resistors R102 and R103 which is connected in series between the input signal terminals Vinp and Vinn.

For example, a Mach-Zehnder Modulator (MZM) or the like is connected to the differential output signal terminals Voutp and Voutn.

In this example, for example, as the second stage amplifier circuit 102, the amplifier circuit of the first example, the amplifier circuit of the second example, or the amplifier circuit that the variable negative capacitance circuit 2b of the third example is applied to the variable negative capacitance circuit in the first and second examples, is used.

Figure 8:
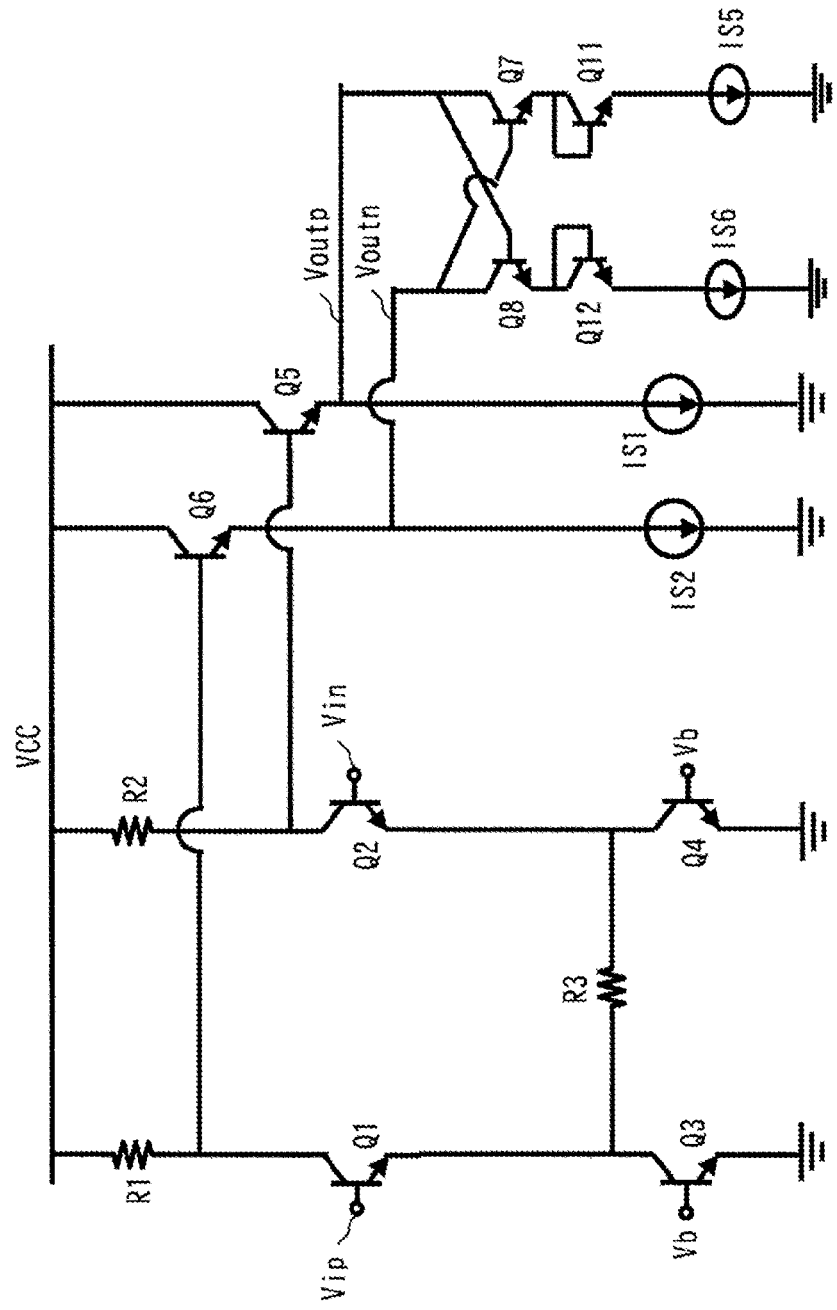
FIG. 8 is a circuit diagram showing a configuration of a fixed peaking amount amplifier circuit according to the fourth embodiment of the present invention.

An amplifier circuit having the fixed frequency peaking amount as shown in FIG. 8 is used as the third stage amplifier circuit 103 cascaded to the amplifier circuit 102. This amplifier circuit removes the capacitor C1 from the amplifier circuit shown in FIG. 1, applies the variable negative capacitance circuit of the third embodiment as the variable negative capacitance circuit, and further modified the variable current sources IS3 and IS4 of the variable negative capacitance circuit to a constant current sources IS5 and IS6.

The amplifier circuit of the first to third embodiments has a configuration in which two peaking frequencies appear by a variable degeneration circuit and a variable negative capacitance circuit.

On the other hand, in the present embodiment, a driver circuit in which three peaking frequencies appear can be realized by combining an amplifier circuit having a variable peaking amount and an amplifier circuit having a fixed frequency peaking amount. Further, by increasing the number of amplifier circuits having a fixed frequency peaking amount, it is possible to generate four or more peaking frequencies.

In the present embodiment, since a structure for peaking control is not required by using an amplifier circuit of the fixed frequency peaking amount, a circuit layout is simplified and parasitic capacitance is reduced, the peaking frequency can be set on the higher frequency side. As a result, the band of the entire driver circuit can be extended.

Figure 9:
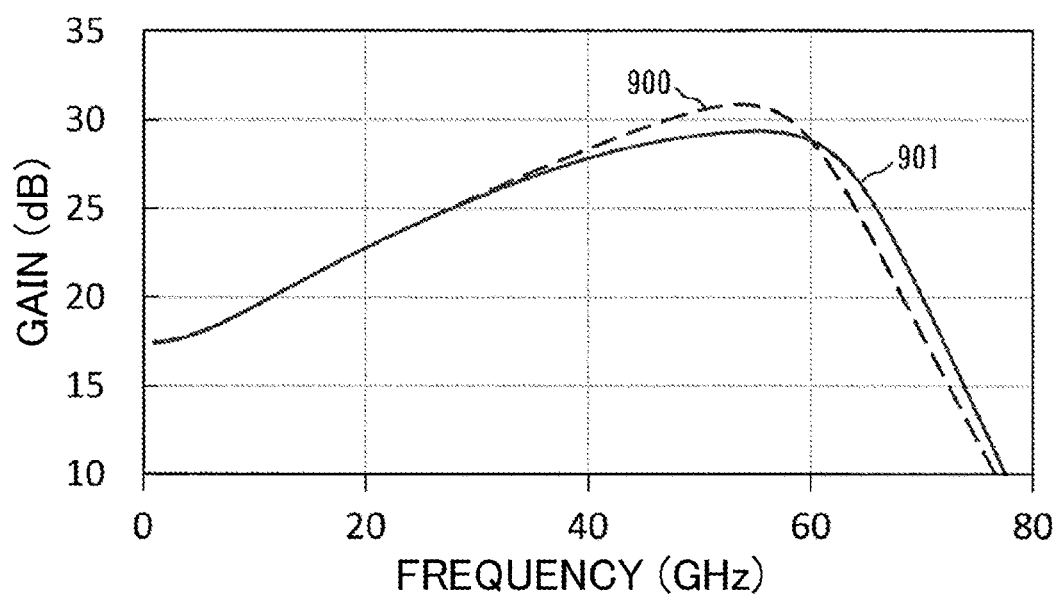
FIG. 9 is a diagram showing a simulation result of the gain of the driver circuit according to the fourth embodiment of the present invention.

FIG. 9 shows the result of simulation of the gain of the driver circuit when the amplifier circuit of the second embodiment is used as the amplifier circuit 102 of the second stage and the amplifier circuit shown in FIG. 8 is used as the amplifier circuit 103 of the third stage. 900 in FIG. 9 shows the gain of the driver circuit when only the amplifier circuit of the second embodiment is used by setting the amplifier circuit to one stage, 901 shows the gain of the driver circuit when the amplifier circuit of the second embodiment is used as the amplifier circuit 102 of the second stage, and the amplifier circuit shown in FIG. 8 is used as the amplifier circuit 103 of the third stage.

It can be confirmed that the band of the present embodiment is wider than that of the case of only the amplifier circuit having a variable frequency peaking amount.

As an amplifier circuit having a fixed frequency peaking amount, an amplifier circuit in which the variable resistors R100 and R101 of the amplifier circuit shown in FIG. 10 are fixed resistors may be used.

Industrial Applicability

Embodiments of the present invention can be applied to an amplifier circuit.

REFERENCE SIGNS LIST 1,1a Variable degeneration circuit
2, 2a, 2b Variable negative capacitance circuit 100 Driver circuit
101 Input buffer
102, 103 Amplifier circuit
104 Output circuit
Q1 to Q8, Q11, Q12 Transistor
Q9, Q10 MOS transistor
R1 to R3, R102, R103 Resistor
C1 Variable capacitance
C2 to C6, C100, C101 Capacitor
IS1, IS2, IS5, IS6 Constant current source
IS3, IS4 Variable current source.

The invention claimed is:

1. An amplifier circuit, comprising:
a first transistor and a second transistor having a differential configuration in which base terminals of the first transistor and the second transistor are connected to differential input signal terminals of an amplifier circuit,
a third transistor having a base terminal connected to a collector terminal of the second transistor, a collector terminal connected to a power supply voltage, and an emitter terminal connected to a first output signal terminal on a positive phase side of an amplifier circuit;
a fourth transistor having a base terminal connected to a collector terminal of the first transistor, a collector terminal connected to the power supply voltage, and an emitter terminal connected to a second output signal terminal on an opposite phase side of the amplifier circuit, a variable degeneration circuit connected to emitter terminals of the first transistor and the second transistor; and
a variable negative capacitance circuit connected to the first output signal terminal and second output signal terminal;
wherein the variable negative capacitance circuit includes:
fifth and sixth transistors whose collector terminals are connected to the first output signal terminal and the second output signal terminal and whose base terminals and collector terminals are connected in a cross-coupled manner;
a first variable current source having a first end connected to an emitter terminal of the fifth transistor and a second end connected to ground; and
a second variable current source having a first end connected to an emitter terminal of the sixth transistor and a second end connected to ground.

2. The amplifier circuit according to claim 1, wherein the variable negative capacitance circuit further includes:
a capacitor connected between an emitter terminal of the fifth transistor and an emitter terminal of the sixth transistor.

3. The amplifier circuit according to claim 2, wherein the variable degeneration circuit includes:
a variable capacitance and a first resistor connected in parallel between an emitter terminal of the first transistor and an emitter terminal of the second transistor.

4. The amplifier circuit according to claim 1, wherein the variable negative capacitance circuit further includes:
a third capacitor a fourth capacitor connected in series between an emitter terminal of the fifth transistor and an emitter terminal of the sixth transistor.

5. The amplifier circuit according to claim 4, wherein the variable degeneration circuit includes:
a first resistor connected between an emitter terminal of the first transistor and an emitter terminal of the second transistor;
a first capacitor and a first variable resistor connected in series between an emitter terminal of the first transistor and an emitter terminal of the second transistor; and
a second variable resistor and a second capacitor connected in series between the emitter terminal of the first transistor and the emitter terminal of the second transistor.

6. The amplifier circuit according to claim 5, wherein an arrangement of the variable degeneration circuit in a direction from the emitter terminal of the first transistor to the emitter terminal of the second transistor and an arrangement of the variable degeneration circuit in a direction from the emitter terminal of the second transistor to the emitter terminal of the first transistor are matched.

7. The amplified circuit according to claim 6, wherein an arrangement of the variable negative capacitance circuit in a direction from the emitter terminal of the fifth transistor to the emitter terminal of the sixth transistor and an arrangement of the variable negative capacitance circuit in a direction from the emitter terminal of the sixth transistor to the emitter terminal of the fifth transistor are matched.

8. The amplifier circuit according to claim 1, wherein the variable negative capacitance circuit further includes:
a seventh transistor between the fifth transistor and the first variable current source, the seventh transistor having a base terminal and a collector terminal connected to the emitter terminal of the fifth transistor and an emitter terminal connected to the first end of the first variable current source; and
an eighth transistor between the sixth transistor and the second variable current source, the eighth transistor having a base terminal and a collector terminal connected to the emitter terminal of the sixth transistor and an emitter terminal connected to the first end of the second variable current source.

9. The amplifier circuit according to claim 8, wherein the variable degeneration circuit further includes:
a variable capacitance and a first resistor are connected in parallel between an emitter terminal of the first transistor and an emitter terminal of the second transistor.

10. The amplifier circuit according to claim 8, wherein the variable degeneration circuit further includes:
a first resistor connected between an emitter terminal of the first transistor and an emitter terminal of the second transistor,
a first capacitor and a first variable resistor connected in series between an emitter terminal of the first transistor and an emitter terminal of the second transistor, and
a second variable resistor and a second capacitor connected in series between the emitter terminal of the first transistor and the emitter terminal of the second transistor.

11. The amplifier circuit according to claim 1, further comprising:
a first current source transistor having a base terminal connected to a bias voltage, a collector terminal connected to the emitter terminal of the first transistor, and an emitter terminal connected to ground;
a second current source transistor having a base terminal connected to the bias voltage, a collector terminal connected to the emitter terminal of the second transistor, and an emitter terminal connected to ground;
a second resistor having a first end connected to the collector terminal of the first transistor and a second end connected to the power supply voltage;

a third resistor having a first end connected to the collector terminal of the second transistor and a second end connected to the power supply voltage;

a first constant current source having a first end connected to the emitter terminal of the third transistor and a second end connected to ground; and a second constant current source having a first end connected to the emitter terminal of the fourth transistor and a second end connected to ground.

12. A driver circuit comprising the amplifier circuit according to claim 1.

13. A driver circuit comprising:
a first amplifier circuit comprising:
  a first transistor and a second transistor having a differential configuration in which base terminals of the first transistor and the second transistor are connected to differential input signal terminals of an amplifier circuit,
  a third transistor having a base terminal connected to a collector terminal of the second transistor, a collector terminal connected to a power supply voltage, and an emitter terminal connected to a first output signal terminal on a positive phase side of an amplifier circuit;
  a fourth transistor having a base terminal connected to a collector terminal of the first transistor, a collector terminal connected to the power supply voltage, and an emitter terminal connected to a second output signal terminal on an opposite phase side of the amplifier circuit,
a variable degeneration circuit connected to emitter terminals of the first transistor and the second transistor; and
a variable negative capacitance circuit connected to the first output signal terminal and second output signal terminal;
  wherein the variable negative capacitance circuit includes:
    fifth and sixth transistors whose collector terminals are connected to the first output signal terminal and the second output signal terminal and whose base terminals and collector terminals are connected in a cross-coupled manner;
    a first variable current source having a first end connected to an emitter terminal of the fifth transistor and a second end connected to ground; and
    a second variable current source having a first end connected to an emitter terminal of the sixth transistor and a second end connected to ground; and a second amplifier circuit having a fixed frequency peaking amount, wherein the first amplifier circuit and the second amplifier circuit are connected in cascade.

14. The driver circuit according to claim 13, wherein the variable negative capacitance circuit further includes:
a capacitor connected between an emitter terminal of the fifth transistor and an emitter terminal of the sixth transistor.

15. The driver circuit according to claim 14, wherein the variable degeneration circuit includes:
a variable capacitance and a first resistor connected in parallel between an emitter terminal of the first transistor and an emitter terminal of the second transistor.

16. The driver circuit according to claim 13, wherein the variable negative capacitance circuit further includes:
a third capacitor a fourth capacitor connected in series between an emitter terminal of the fifth transistor and an emitter terminal of the sixth transistor.

17. The driver circuit according to claim 16, wherein the variable degeneration circuit includes:
a first resistor connected between an emitter terminal of the first transistor and an emitter terminal of the second transistor;
a first capacitor and a first variable resistor connected in series between an emitter terminal of the first transistor and an emitter terminal of the second transistor;
a second variable resistor and a second capacitor connected in series between the emitter terminal of the first transistor and the emitter terminal of the second transistor;
wherein an arrangement of the variable degeneration circuit in a direction from the emitter terminal of the first transistor to the emitter terminal of the second transistor and an arrangement of the variable degeneration circuit a the direction from the emitter terminal of the second transistor to the emitter terminal of the first transistor are matched; and
wherein an arrangement of the variable negative capacitance circuit in a direction from the emitter terminal of the fifth transistor to the emitter terminal of the sixth transistor and an arrangement of the variable negative capacitance circuit in a direction from the emitter terminal of the sixth transistor to the emitter terminal of the fifth transistor are matched.

* * * * *